(12) United States Patent
Tsuda et al.

(10) Patent No.: US 6,535,417 B2
(45) Date of Patent: Mar. 18, 2003

(54) SEMICONDUCTOR STORAGE DEVICE

(75) Inventors: Nobuhiro Tsuda, Tokyo (JP); Koji Nii, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/837,233

(22) Filed: Apr. 19, 2001

(65) Prior Publication Data

US 2002/0012265 A1 Jan. 31, 2002

(30) Foreign Application Priority Data

Jul. 31, 2000 (JP) ........................................ 2000-231167

(51) Int. Cl.[7] .............................................. G11C 11/00
(52) U.S. Cl. ................... 365/154; 365/177; 365/230.05
(58) Field of Search ................................. 365/154, 177, 365/189.01, 189.04, 156, 230.05

(56) References Cited

U.S. PATENT DOCUMENTS

| | | | | |
|---|---|---|---|---|
| 4,933,899 A | * | 6/1990 | Gibbs | ........................ 365/177 |
| 5,057,893 A | | 10/1991 | Sheng et al. | |
| 5,216,636 A | * | 6/1993 | Runaldue | ................ 365/189.04 |
| 5,307,322 A | * | 4/1994 | Usami et al. | ................ 365/154 |
| 5,790,461 A | * | 8/1998 | Holst | .................... 365/189.04 |
| 5,886,375 A | | 3/1999 | Sun | |
| 5,959,931 A | * | 9/1999 | Ueda | ..................... 365/230.05 |

FOREIGN PATENT DOCUMENTS

| | | | |
|---|---|---|---|
| JP | 62-33392 | * | 2/1987 |
| JP | 62-214593 | * | 9/1987 |
| JP | 9-270469 | * | 10/1997 |
| TW | 349246 | | 1/1999 |

* cited by examiner

*Primary Examiner*—David Lam
(74) *Attorney, Agent, or Firm*—Burns, Doane, Swecker & Mathis, LLP

(57) ABSTRACT

An SRAM memory cell is constituted by complementarily connecting first inverter composed of NMOS transistor and a PMOS transistor, and a second inverter composed of another NMOS transistor and another PMOS transistor. Still another NMOS transistor is so provided that its gate is connected to a node between the NMOS and PMOS transistors in the first inverter. Still another NMOS transistor is so provided that its gate is connected to a node between the NMOS and PMOS transistors in the second inverter. As a result, capacity values for gate capacities are added to the storage nodes.

7 Claims, 11 Drawing Sheets

SEMICONDUCTOR STORAGE DEVICE

FIELD OF THE INVENTION

The present invention relates to a semiconductor storage device having an SRAM (Static Random Access Memory) type memory cell. More specifically, this invention relates to a semiconductor storage device which improves resistance to a soft error.

BACKGROUND OF THE INVENTION

In recent years, as the electronic equipments have become light, thin and small, a demand for speeding up functions of the equipments has been strengthened. It is now indispensable to mount a microcomputer to such electric equipments, and it is essential to mount a high-speed memory with large capacity to the microcomputer. Moreover, since personal computers have spread quickly and have required high performance, a large capacity cache memory is required for realizing higher-speed process. Namely, a CPU requires high speed and large capacity as for RAM used when a control program or the like is executed.

DRAM (Dynamic RAM) and SRAM are generally used as the RAM. SRAM is normally used as the above-mentioned cache memory which requires processing to be done at a high-speed. High-resistance load type SRAM composed of four transistors and two high-resistance elements and CMOS type SRAM composed of six transistors are known. Particularly the CMOS type SRAM has high reliability because a leak current at the time of holding the data is very small. At present the CMOS type SRAM is most commonly used.

FIG. 20 is a circuit diagram of a memory cell of the conventional CMOS type SRAM. Only a circuit portion for holding memory is shown. That is, an access-use MOS transistor for reading and writing a memory state is omitted. As shown in this figure, the memory cell can be represented by two inverters INV1 and INV2 whose input terminals and output terminals are connected with each other complementarily.

FIG. 21 shows the internal circuit of the inverters INV1 and INV2. That is, this figure shows the CMOS in verter circuit. As shown in FIG. 21, both the inverters INV1 and INV2 are composed of one PMOS transistor PM1 and one NMOS transistor NM1, respectively. Source of the PMOS transistor PM1 is connected to a power-supply line $V_{DD}$, and source of the NMOS transistor NM1 is connected to a ground line GND. Drains of both the transistors are connected to each other. The node of these drains work as an output terminal OUT. Gates of both the transistors are connected to each other. The node of these gates work as an input terminal IN. Namely, a so-called CMOS structure, in which the PMOS transistor PM1 is a load transistor and NMOS transistor NM1 is a drive transistor, realizes the in verter function.

Operation of the CMOS in verter circuit shown in FIG. 21 will be explained below. When an electric potential at a high logical level (hereafter, "H"), namely, potential $V_{DD}$ is applied to the input terminal IN, the PMOS transistor PM1 is brought in to OFF state, and NMOS transistor NM1 is brought into ON state.

As a result, the output terminal OUT is electrically connected to the ground line via the NMOS transistor NM1, and its electric potential becomes an electric potential at a low logical level (hereafter, "L"), namely, a GND potential.

On the contrary, when an electric potential with logical level "L", namely, a GND potential is applied to the input terminal IN, the PMOS transistor PM1 is brought in to ON state, and the NMOS transistor NM1 is brought in to OFF state. Resultantly, the output terminal OUT is electrically connected to the power-supply line via the PMOS transistor PM1, and its electric potential becomes an electric potential with logical level "H", namely, $V_{DD}$ potential. In such a manner, the CMOS inverter circuit holds a relationship that input and output logics are complementary.

Next, the conventional memory cell shown in FIG. 20 will be explained blow. The input terminal of the inverter INV1 and the output terminal of the inverter INV2 are connected with each other, and the output terminal of the inverter INV1 and the input terminal of the inverter INV2 are connected with each other. Accordingly, storage nodes NA and NB in the drawing hold a complementary relationship.

For example, if the storage node NA is in a state of an electric potential with logical level "H", the storage node NB is in a state of an electric potential with logical level "L" so as to be stable. Further, on the contrary, if the memory node NA is in a state of an electric potential with logical level "L", the storage node NB is in a state of an electric potential with logical level "H" so as to be stable. The memory cell composed of the inverters has two different and stable logical states according to the "H" or "L" state of the two memory nodes NA and NB. The logical states are held as storage data of 1 bit.

A semiconductor storage device which is composed of the CMOS inverter circuit is very stable, and resistance to noises has not become a problem. However, in the case of the above-mentioned memory with large capacity in which a lot of memory cells are integrated, since an area of the memory cell per 1 bit becomes very small, the memory is exposed to radioactive rays with ionization characteristic so as to be influenced by generated electric charges. Namely, the radioactive rays are emitted so that the storage state of the memory cell becomes unstable, and the possibility of occurrence of malfunction such as inversion of storage data becomes high.

This phenomenon is called as a soft error, the radioactive rays with ionization characteristic are generated from α-rays emitted from the package material or the wiring material. Particularly, the soft error occurs more easily as a power-supply voltage becomes lower. For this reason, in a semiconductor storage device which is driven by a low power-supply in recent years, an important theme is how to increase the resistance to the soft error.

Various semiconductor storage devices are known in which a capacity value of the storage nodes is in creased thereby preventing the in version of storage data due to the emission of α-rays. For example, according to "a semiconductor memory device" disclosed in Japanese Patent Application Laid-Open No. 9-270469, a thin active region intervenes between a storage node (namely, a connecting portion between a gate of a load transistor and a gate of a driving transistor composing a CMOS inverter circuit) and a semiconductor substrate so that a capacitor is formed, and thus a capacity value of the storage node portion is in creased.

Meanwhile, a non-volatile semiconductor storage devices composed of a SRAM memory cell, an access-use transistor and some capacitors are also known. The capacity value of the storage node portion becomes an important problem also in these non-volatile semiconductor storage device.

According to this non-volatile semiconductor storage device, an electric potential is determined by dividing capacity of many capacitors so that writing is executed, and reading at the time when the power-supply is ON is executed according to a relationship in the capacity value of the capacitors connected to the storage node. For this reason, it is difficult to adequately design the capacitors. Therefore, in "a semiconductor non-volatile memory device" disclosed in Japanese Patent Application Laid-Open No. 62-33392, in stead of capacitors, a gate of the MOS transistor having a floating gate is connected to a storage node of a SRAM memory cell so that a non-volatile memory section is constituted, and the number of capacitors is decreased.

However, according to a demand for larger capacity and higher integration of the semiconductor storage device, it is necessary to make components of the memory cell fine. For this reason, a capacity value of the storage node portion becomes smaller, and thus a soft error occurs more easily.

In order to cope with the above problem, the capacity value of the storage node portion is in creased in the prior memory cell in "the semiconductor memory device" disclosed in Japanese Patent Application Laid-Open No. 9-270469. As a result, a specified semiconductor layout pattern should be adopted, and in order to obtain a layout pattern which is changed according to high integration of future memory cells, the steps of designing the layout pattern become complicated. This prior memory cell is not always a flexible countermeasure.

Further, in "the semiconductor non-volatile memory device" disclosed in Japanese Patent Application Laid-Open No. 62-33392, the MOS transistor which is connected to the storage node of the SRAM memory cell composes a non-volatile memory section, and the MOS transistor should be formed by a layout for providing a floating gate. Further, the situation that the memory holding state of the floating gate is changed by emission of α-rays cannot be denied. Namely, this "semiconductor non-volatile memory device" cannot realize both the non-volatile memory function and the countermeasure against a soft error, and it is not intended.

Further, the "semiconductor non-volatile memory device" disclosed in Japanese Patent Application Laid-Open No. 62-33392 has problems that control of SRAM from the outside, such that an applied voltage to SRAM should be changed in two steps, is complicated and design for this control is also complicated.

SUMMARY OF THE INVENTION

It is an object of this invention to obtain a semiconductor storage device in which a PMOS transistor or an NMOS transistor whose design and manufacturing steps are established are provided in a SRAM memory cell, and a gate of the added MOS transistor is connected to a storage node so that an in crease of a capacity value of the storage node portion, namely, countermeasure against a soft error is realized.

The semiconductor storage device according to one aspect of this invention comprises a first MOS transistor having a source connected to a ground line; a second MOS transistor of a conductive type same as that of the first MOS transistor, the second MOS transistor having a source connected to a ground line, a drain connected to a gate of the first MOS transistor and its node being a first node, and a gate connected to a drain of the first MOS transistor and its connection point being a second node; a third MOS transistor having a gate connected to the first node; and a fourth MOS transistor having a gate connected to the second node.

For example, diode-connected load transistor s such as MOS transistor s are connected respectively to the drains of first and second MOS transistor s so that the SRAM memory cell is composed. Since the gates of third and fourth MOS transistor s are connected respectively to first and second nodes to be storage nodes, capacity values for these gate capacities can be added to the storage nodes.

Other objects and features of this invention will become apparent from the following description with reference to the accompanying drawings.

DESCRIPTION OF THE PREFERRED EMBODIMENTS

Eight preferred embodiments of a semiconductor storage device of the present invention will be described here with reference to the drawings. However, this invention is not limited only to these embodiments.

A semiconductor storage device according to a first embodiment will be explained first. The semiconductor storage device according to the first embodiment is characterized in that two NMOS transistors which does not influence a memory holding state of a memory cell composing SRAM are provided and gates of the NMOS transistors are connected to two storage nodes respectively.

Figure 1:
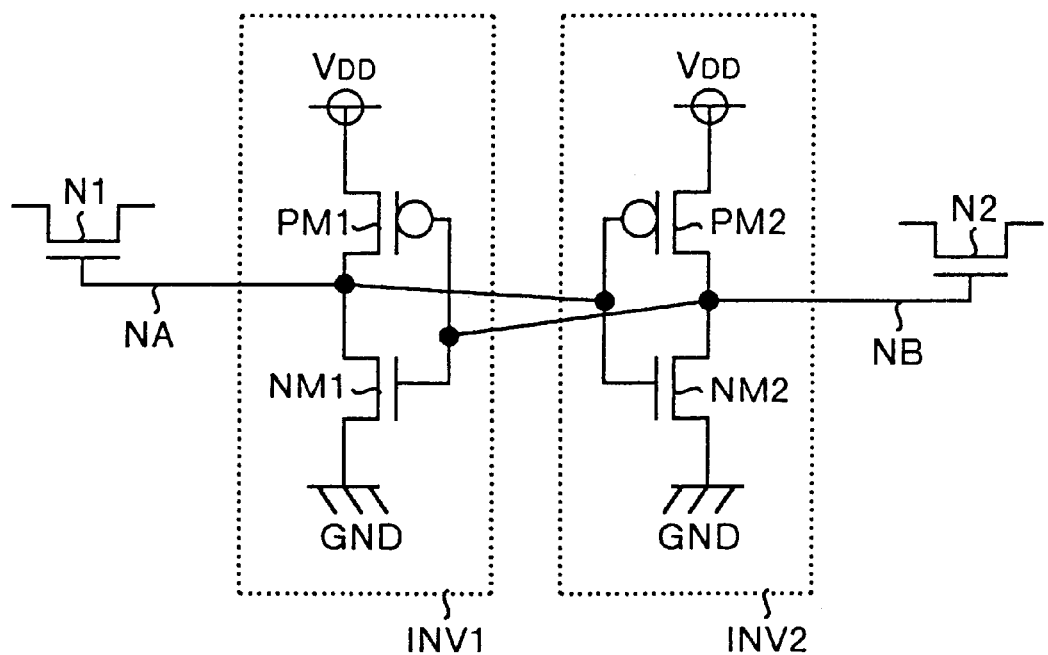
FIG. 1 is a circuit diagram of a SRAM memory cell composing a semiconductor storage device according to a first embodiment.

FIG. 1 is a circuit diagram of a SRAM memory cell composing the semiconductor storage device according to the first embodiment. The SRAM memory cell composing the semiconductor storage device according to the first embodiment is composed of two inverters INV1 and INV2 connected complementarily in the same manner as the conventional memory cell. FIG. 1 also shows the internal structure of the respective inverters, namely, CMOS inverter circuits.

As shown in FIG. 1, the CMOS inverter circuit corresponding to the inverter INV1 comprises a PMOS transistor PM1 and an NMOS transistor NM1, and the CMOS inverter circuit corresponding to the inverter INV2 comprises a PMOS transistor PM2 and an NMOS transistor NM2.

Source of the PMOS transistor PM1 and source of the PMOS transistor PM2 are connected to power-supply line $V_{DD}$, and source of the NMOS transistor NM1 and source of the NMOS transistor NM2 are connected to ground line GND. Drains of the PMOS transistor PM1 and the NMOS transistor NM1 are connected to each other, and gates of the PMOS transistor PM1 and the NMOS transistor NM1 are connected to each other.

Drains of the PMOS transistor PM2 and the NMOS transistor NM2 are connected to each other, and the drain of the PMOS transistor PM2 is connected to the gate of the PMOS transistor PM1 so that a storage node NB is formed at the connection line. Further, gates of the PMOS transistor PM2 and the NMOS transistor NM2 are connected to each other, and the gate of the PMOS transistor PM2 is connected to the drain of the PMOS transistor PM1 so that a storage node NA is formed at the connection line.

Further, in addition to the two inverters, an NMOS transistor N1 whose gate is connected to the storage node NA, and an NMOS transistor N2 whose gate is connected to the storage node NB are provided. In the first embodiment, connecting destinations of sources and drains of the NMOS transistor N1 and the NMOS transistor N2 are not particularly limited and are in open state.

Operation of the SRAM memory cell composing the semiconductor storage device according to the first embodiment, namely, the SRAM memory cell shown in FIG. 1 will be explained below. When the storage node NA is in an electric potential state of logical level "H", the storage node NB is brought in to a potential state of logical level "L" so as to be stable. On the contrary, when the storage node NA is in an electric potential of logical level "L", the storage node NB is in a potential state of logical level "H" so as to be stable. The memory cell which is composed of the inverters has two different and stable logical states according to the logical state "H" or "L" of the two storage nodes NA and NB, and the logical states are held as storage data of 1 bit.

Since the storage node NA is connected with the gate of the NMOS transistor N1, the state of the NMOS transistor N1 is determined as ON or OFF according to the logical state of the storage node NA. Moreover, since the storage node NB is connected with the gate of the NMOS transistor N2, the state of the NMOS transistor N2 is determined as ON or OFF according to the logical state of the storage node NB. However, a change in the ON/OFF state of the NMOS transistors N1 and N2 does not influence the two stable storage states of the storage nodes NA and NB.

Meanwhile, the storage node NA is connected with the gate of the NMOS transistor N1 so that the gate capacity is added to the storage node NA. Similarly, the storage node NB is connected with the gate of the NMOS transistor N2, the gate capacity is added to the storage node NB. Namely, the capacity values of the storage nodes NA and NB become larger than those of the prior SRAM memory cell.

As mentioned above, according to the semiconductor storage device of the first embodiment, the two NMOS transistors N1 and N2 are provided in the SRAM memory cell, and the gates of the NMOS transistors N1 and N2 are connected to the storage nodes NA and NB respectively. For this reason, the capacity values for the gate capacities of the NMOS transistors N1 and N2 can be added to the storage nodes NA and NB respectively. As a result, misoperation such as inversion of the storage data due to external factors such as α-ray hardly occurs, and thus the resistance to a soft error can be improved.

In addition, since design and manufacturing steps are established in the newly provided NMOS transistors N1 and N2, various layout patterns can be adopted according to semiconductor storage devices with different storage capacities. Moreover, the NMOS transistors N1 and N2 as well as the MOS transistors composing the inverters INV1 and INV2 can be formed by the same manufacturing steps using the same mask pattern. For this reason, the capacity values of the storage nodes NA and NB can be in creased with out adding complicated design and manufacturing step.

It is mentioned above that the newly added MOS transistors are NMOS transistors, however, they could be PMOS transistor. This corresponds to a case where connection represented by dotted lines in FIG. 5, mentioned later, is not executed.

Next, the semiconductor storage device according to a second embodiment will now be explained. The semiconductor storage device according to the second embodiment is characterized in that the sources and drains of the newly added NMOS transistors N1 and N2 are connected to ground lines in the SRAM memory cell of the semiconductor storage device in the first embodiment.

Figure 2:
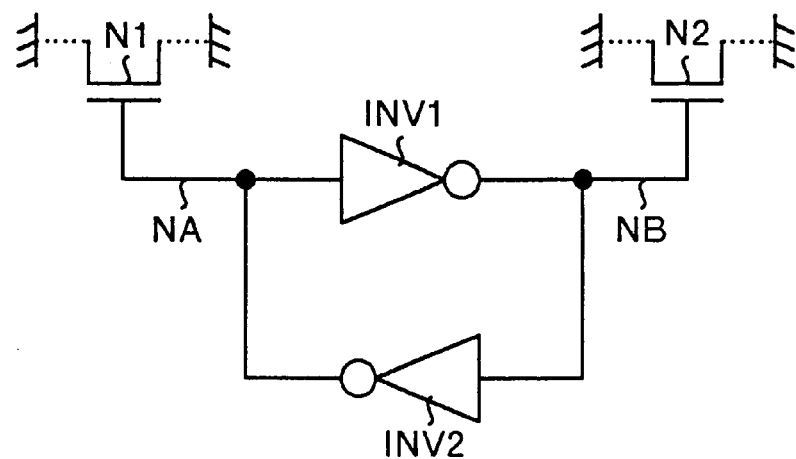
FIG. 2 is a circuit diagram of the SRAM memory cell composing the semiconductor storage device according to a second embodiment.
Figure 20:
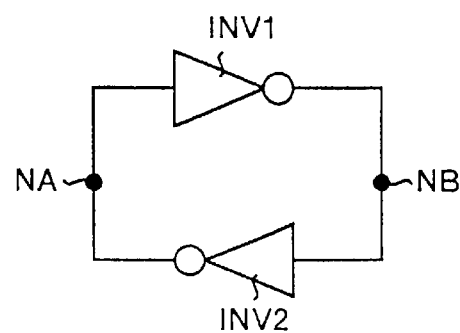
FIG. 20 is a circuit diagram of a conventional CMOS type SRAM memory cell.
Figure 21:
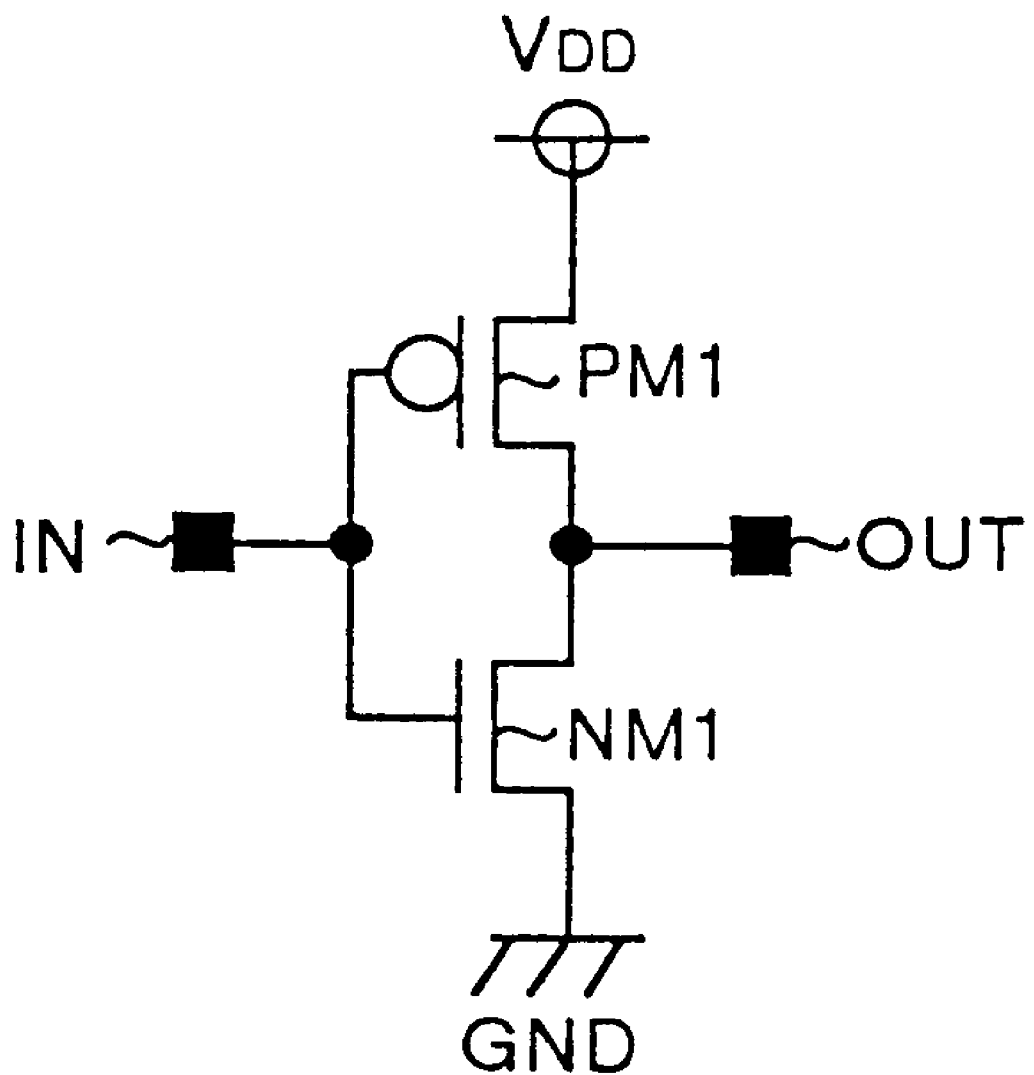
FIG. 21 is a circuit diagram of a conventional CMOS inverter circuit.

FIG. 2 is a circuit diagram of the SRAM memory cell composing the semiconductor storage device according to the second embodiment. Same legends are provided to the portions that are common to those in FIG. 1, and the description thereof is omitted. Moreover, in FIG. 2, the inverters INV1 and INV2 are represented by logic symbols so as to be simplified like FIG. 20.

The semiconductor storage device according to the second embodiment is different from the same in the first embodiment in that the drains and sources of the NMOS transistors N1 and N2 are connected to the ground lines in the SRAM memory cell as shown by dotted lines in FIG. 2.

Since the storage node NA is connected to the gate of the NMOS transistor N1, the state of the NMOS transistor N1 is determined as ON or OFF according to the logical state of the storage node NA. Moreover, since the storage node NB is connected with the gate of the NMOS transistor N2, the state of the NMOS transistor N2 is determined as ON or OFF according to the logical state of the storage node NB. However, a change in the ON/OFF state of the NMOS transistors N1 and N2 does not influence the two stable storage states of the storage nodes NA and NB.

Meanwhile, the storage node NA is connected with the gate of the NMOS transistor N1 so that the gate capacity is added to the storage node NA. Similarly, the storage node NB is connected with the gate of the NMOS transistor N2, the gate capacity is added to the storage node NB. Namely, the capacity values of the storage nodes NA and NB become larger than those of the prior SRAM memory cell.

As mentioned above, according to the semiconductor storage device of the second embodiment, since the gates of the newly provided two NMOS transistors N1 and N2 are connected to the storage nodes NA and NB in the SRAM memory cell, the same effect as that in the first embodiment can be obtained.

Further, in the second embodiment, since the sources and drains of the newly added NMOS transistors N1 and N2 are not in open state but are connected with the ground lines, and electric potentials to be applied to the gates, namely, the electric potentials of the storage nodes NA and NB prevent electric current from flowing in the NMOS transistors N1 and N2 and from fluctuating. As a result, a possibility that the operating state of the NMOS transistors N1 and N2 influences the storage nodes NA and NB can be reduced.

Even if the sources and drains of the NMOS transistors N1 and N2 are connected to the power-supply lines, the above effect can be obtained.

The semiconductor storage device according to a third embodiment will now be explained. The semiconductor storage device according to the third embodiment is characterized in that the sources of newly added NMOS transistors N1 and N2 are connected to the ground lines and their drains are connected to each other in the SRAM memory cell of the semiconductor device of the first embodiment.

Figure 3:
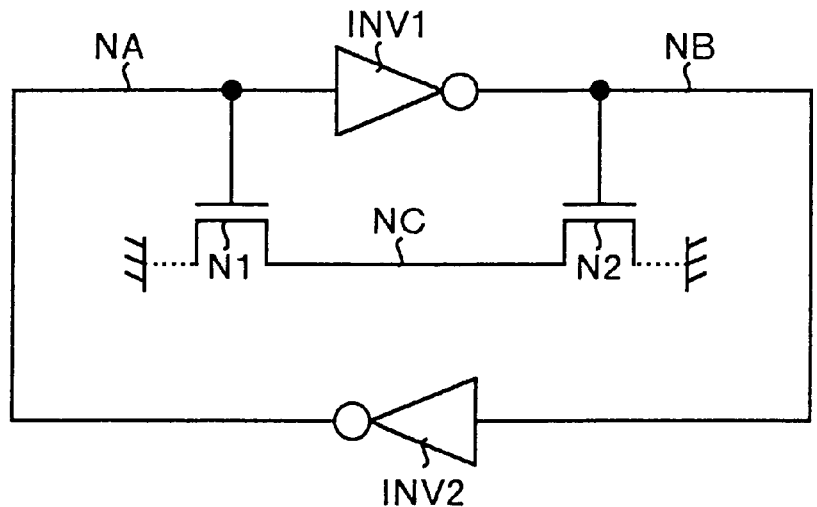
FIG. 3 is a circuit diagram of the SRAM memory cell composing the semiconductor storage device according to a third embodiment.

FIG. 3 is a circuit diagram of the SRAM memory cell composing the semiconductor device according to the third embodiment. Same legends are provided to the portions that are common to those in FIG. 1, and the description thereof is omitted. Moreover, in FIG. 3 the inverters INV1 and IN2 are represented by logic symbols so as to be simplified like FIG. 20.

The semiconductor storage device according to the third embodiment is different from the same in the first embodiment in that the drains of the NMOS transistors N1 and N2 are connected to the ground lines in the SRAM memory cell as shown by dotted lines in FIG. 3, and further the drains of the NMOS transistors N1 and N2 are connected to each other.

Next, the portion of the operation of the SRAM memory cell shown in FIG. 3 different from the first embodiment will be explained below. Since the storage node NA is connected to the gate of the NMOS transistor N1, the state of the NMOS transistor N1 is determined as ON or OFF according to the logical state of the storage node NA. Moreover, since the storage node NB is connected with the gate of the NMOS transistor N2, the state of the NMOS transistor N2 is determined as ON or OFF according to the logical state of the storage node NB. However, a change in the ON/OFF state of the NMOS transistors N1 and N2 does not influence the two stable storage states of the storage nodes NA and NB.

Further, when the storage node NA is stable in the logical state "H", the NMOS transistor N1 is in ON state, and the NMOS transistor N2 is in OFF state. Here, an internal node NC which is a connection line for connecting the drains of the NMOS transistors N1 and N2 is electrically connected with the ground line GND via the NMOS transistor N1, and its electrical potential is at the logical level "L", namely, in the logical state "L".

On the contrary, when the storage node NA is stable in the logical state "L", the NMOS transistor N1 is in OFF state, and the NMOS transistor N2 is ON state. As a result, the internal node NC is electrically connected with the ground line GND via the NMOS transistor N2, and its electric potential is at the logical level "L", namely, in the logical state "L".

However, a change in the state of the internal node NC does not influence the two stable storage states of the storage nodes NA and NB. Meanwhile, the storage node NA is connected to the gate of the NMOS transistor N1 so that its gate capacity is added to the storage node NA. Similarly, since the storage node NB is connected to the gate of the NMOS transistor N2, its gate capacity is added to the storage node NB. Namely, the capacity values of the storage nodes NA and NB become larger than the prior SRAM memory cell.

As mentioned above, according to the semiconductor storage device of the third embodiment, since the gates of the two NMOS transistors N1 and N2 are connected to the storage nodes NA and NB in the SRAM memory cell, the same effect as that in the first embodiment can be obtained.

Further, in the third embodiment, since the sources and drains of the newly added NMOS transistors N1 and N2 are not in open state but are connected with the ground lines and the drains are connected to each other, electric potentials to be applied to the gates, namely, the electric potentials of the storage nodes NA and NB prevent electric current from flowing in the NMOS transistors N1 and N2 and from fluctuating. As a result, a possibility that the operating state of the NMOS transistors N1 and N2 influences the storage nodes NA and NB can be reduced.

Even if the sources of the NMOS transistors N1 and N2 are connected to each other, and the drains are connected to the power-supply lines, the above effect can be obtained.

The semiconductor storage device according to a fourth embodiment will now be explained. The semiconductor storage device according to the fourth embodiment is characterized in that the source, drain and the gate of the newly added NMOS transistor N1 are connected to each other and the source, drain and the gate of the NMOS transistor N2 are connected to each other in the SRAM memory cell of the semiconductor storage device in the first embodiment.

Figure 4:
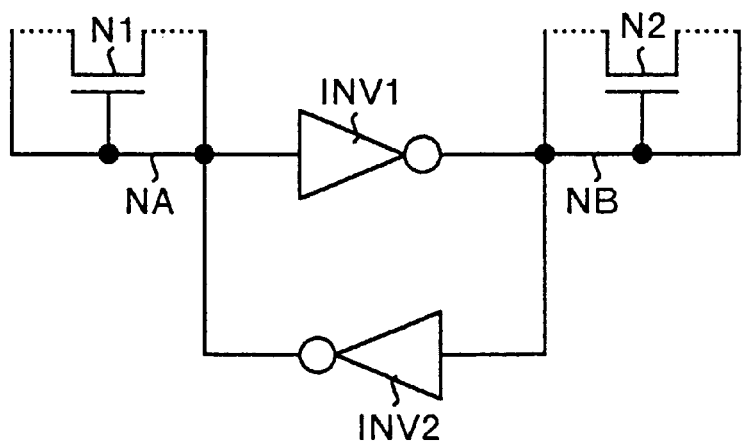
FIG. 4 is a circuit diagram of the SRAM memory cell composing the semiconductor storage device according to a fourth embodiment.

FIG. 4 is a circuit diagram of the SRAM memory cell composing the semiconductor storage device according to the fourth embodiment. Same legends are provided to the portions that are common to those in FIG. 1, and the description thereof is omitted. Moreover, in FIG. 4, the inverters INV1 and INV2 are represented by the logic symbols so as to be simplified like FIG. 20.

The semiconductor storage device according to the fourth embodiment is different from the same in the first embodiment in that the source, drain and gate of the NMOS transistor N1 are connected to each other and the source, drain and gate of the NMOS transistor N2 are connected to each other in the SRAM memory cell as shown by dotted lines in FIG. 4.

Next, the portion of the operation of the SRAM memory cell shown in FIG. 4 different from the first embodiment will be explained below. Since the storage node NA is connected to the gate of the NMOS transistor N1, the state of the NMOS transistor N1 is determined as ON or OFF according to the logical state of the storage node NA. Moreover, since the storage node NB is connected with the gate of the NMOS transistor N2, the state of the NMOS transistor N2 is determined as ON or OFF according to the logical state of the storage node NB. However, a change in the ON/OFF state of the NMOS transistors N1 and N2 does not influence the two stable storage states of the storage nodes NA and NB.

Further, when the storage node NA is stable in the logical state "H", the NMOS transistor N1 is in ON state, and the NMOS transistor N2 is in OFF state. Here, since the source, drain and the gate are connected to each other, they have the electric potential same as that of the storage node NA regardless of the ON state, and the NMOS transistor N1 shows the logical state "H". Since the source, drain and the gate of the NMOS transistor N2 are also connected to each other, they have the electric potential same as that of the storage node NB regardless of the OFF state, the NMOS transistor N2 shows the logical state "L".

On the contrary, when the storage node NA is stable in the logical state "L", the NMOS transistor N1 is in OFF state, and the NMOS transistor N2 is ON state. Here, since the source, drain and the gate of the NMOS transistor N1 are connected to each other, they have the electric potentials same as that of the storage node NA regardless of the OFF state, the NMOS transistor N1 shows the logical state "L". Since the source, drain and gate of the NMOS transistor N2 are also connected to each other, they have the electric potentials same as that of the storage node NB regardless of ON state, and the NMOS transistor N2 shows the logical state "H".

Therefore, a change in the ON/OFF state of the NMOS transistors N1 and N2 does not influence the two stable storage states of the storage nodes NA and NB. Meanwhile, the storage node NA is connected to the gate of the NMOS transistor N1 so that its gate capacity is added to the storage node NA. Similarly, since the storage node NB is connected to the gate of the NMOS transistor N2, its gate capacity is added to the storage node NB. Namely, the capacity values of the storage nodes NA and NB become larger than the prior SRAM memory cell.

As mentioned above, according to the semiconductor storage device of the fourth embodiment, since the gates of the newly provided NMOS transistors N1 and N2 are connected to the storage nodes NA and NB in the SRAM memory cell, the same effect as that in the first embodiment can be obtained.

Further, since the sources and drains of the added NMOS transistors N1 and N2 are not in open state but the sources, drains and gates are connected with each other and the drains are connected to each other, electric potentials to be applied to the gates, namely, the electric potentials of the storage nodes NA and NB prevent electric current from flowing in the NMOS transistors N1 and N2 and from fluctuating. As a result, a possibility that the operating state of the NMOS transistors N1 and N2 influences the storage nodes NA and NB can be reduced.

The semiconductor storage device according to the fifth embodiment will now be explained. The semiconductor storage device according to the fifth embodiment is characterized in that a PMOS transistor is provided in stead of the newly added NMOS transistors N1 and N2 in the SRAM memory cell of the semiconductor storage device in the second to fourth embodiments.

Figure 5:
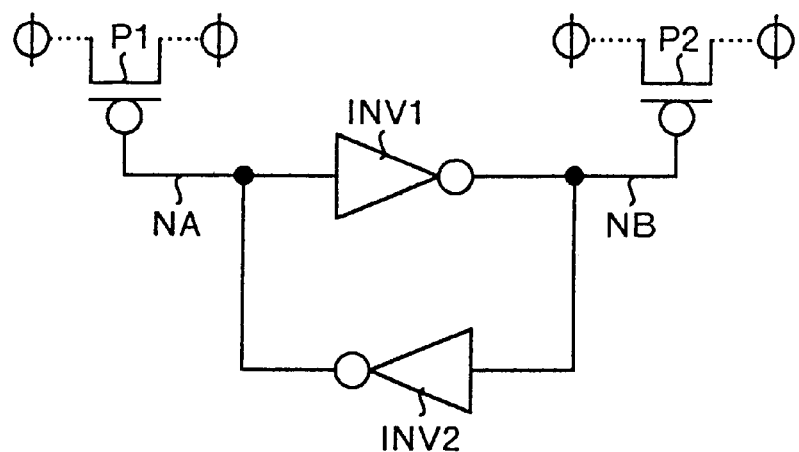
FIG. 5 is one example of a circuit diagram of the SRAM memory cell composing the semiconductor storage device according to a fifth embodiment.

FIG. 5 is one example of a circuit diagram of the SRAM memory cell composing the semiconductor storage device according to the fifth embodiment. Particularly, in the SRAM memory cell shown in FIG. 5, the NMOS transistors N1 and N2 are replaced by PMOS transistors P1 and P2, and sources and drains of the PMOS transistors P1 and P2 are connected to the power-supply lines in the circuit shown in FIG. 2.

In the SRAM memory cell shown in FIG. 5, since the sources and drains of the added PMOS transistors P1 and P2 are not in open state but are connected to the power-supply lines, electric potentials to be applied to the gates, namely, the electric potentials of the storage nodes NA and NB prevent electric current from flowing in the PMOS transistors P1 and P2 and from fluctuating.

Even if the sources and drains of the PMOS transistors P1 and P2 are connected to the ground lines, the same effect as that of the second embodiment can be obtained.

Figure 6:
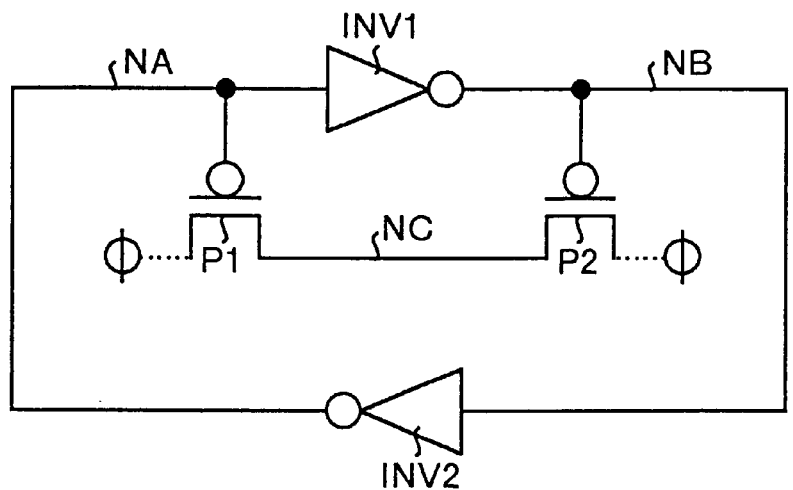
FIG. 6 is one example of a circuit diagram of the SRAM memory cell composing the semiconductor storage device according to the fifth embodiment.

FIG. 6 is another example of the circuit diagram of the SRAM memory cell composing the semiconductor storage device according to the fifth embodiment. Particularly, in the SRAM memory cell shown in FIG. 6, the NMOS transistors N1 and N2 in the third embodiment are replaced by the PMOS transistors P1 and P2, and the sources of the PMOS transistors P1 and P2 are connected to the power-supply lines and the drains are connected to each other in the circuit diagram shown in FIG. 3.

In the SRAM memory cell shown in FIG. 6, when the storage node NA is stable in the logical state "H", the PMOS transistor P1 is in OFF state, and the PMOS transistor P2 is ON state. Here, an internal node NC which is the connection line for connecting the drains of the PMOS transistors P1 and P2 is electrically connected to the power-supply line $V_{DD}$ via the PMOS transistor P2, and its electric potential is at the logical level "H", namely in the logical state state "H".

On the contrary, when the storage node NA is stable in the logical state "L", the PMOS transistor P1 is in ON state, and the PMOS transistor P2 is OFF state. As a result, the internal node NC is electrically connected to the power-supply line $V_{DD}$ via the PMOS transistor P2, and its electric potential is at the logical level "H", namely, in the logical state "H".

However, a change in the state of the internal node NC does not influence the two stable storage states of the storage nodes NA and NB. Further, since the sources and drains of the added PMOS transistors P1 and P2 are not in open state, electric potentials to be added to the gate, namely, the electric potentials of the storage nodes NA and NB prevent electric current from flowing in the PMOS transistors P1 and P2 and from fluctuating.

Even if the sources of the PMOS transistors P1 and P2 are connected to each other and the drains are connected to the ground lines, the same effect as that in the third embodiment can be obtained.

Figure 7:
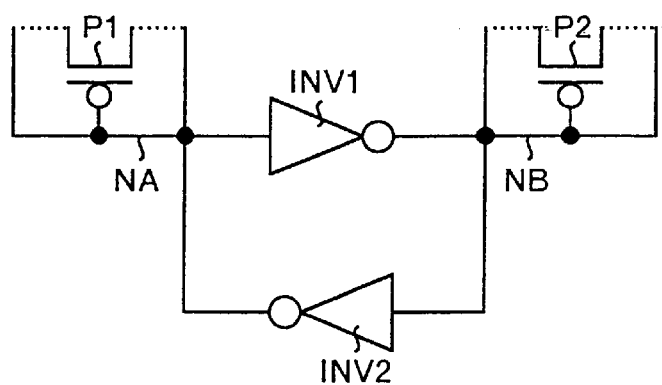
FIG. 7 is one example of a circuit diagram of the SRAM memory cell composing the semiconductor storage device according to the fifth embodiment.
Figure 8:
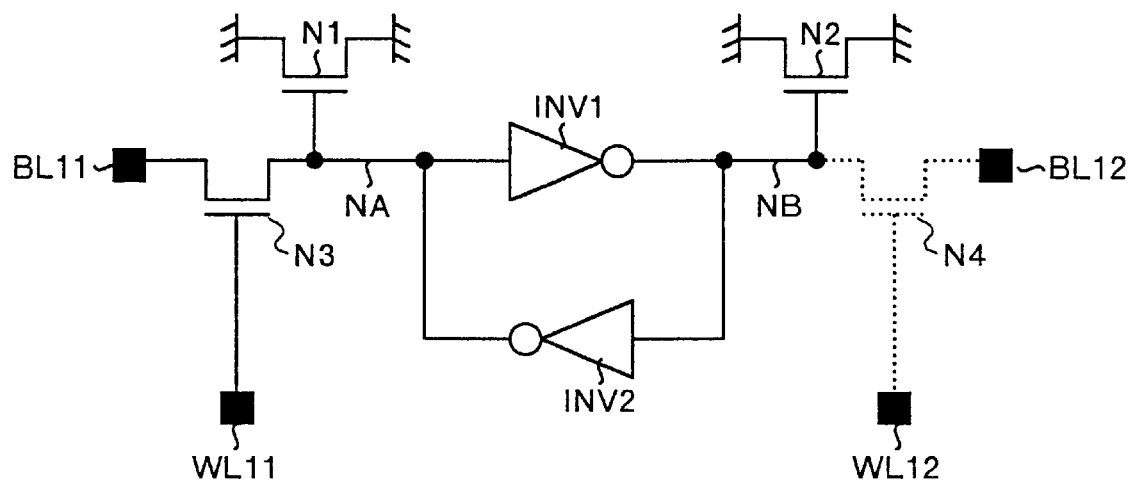
FIG. 8 is one example of a circuit diagram of the SRAM memory cell composing the semiconductor storage device according to a seventh embodiment.
Figure 9:
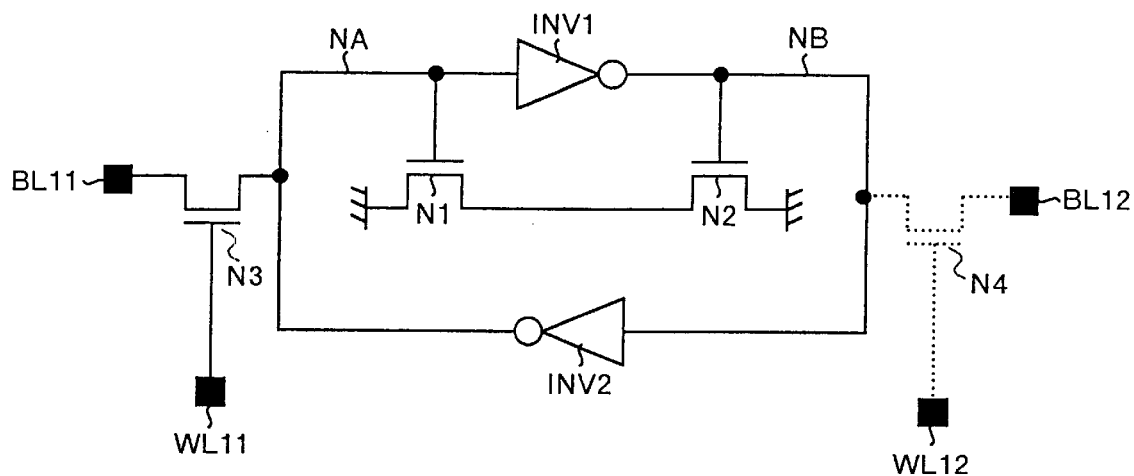
FIG. 9 is one example of a circuit diagram of the SRAM memory cell composing the semiconductor storage device according to the seventh embodiment.
Figure 10:
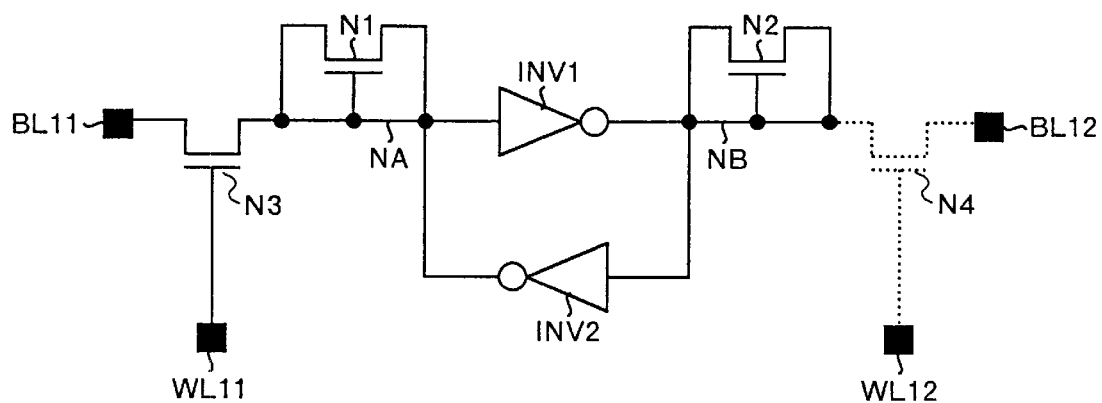
FIG. 10 is one example of a circuit diagram of the SRAM memory cell composing the semiconductor storage device according to the seventh embodiment.
Figure 11:
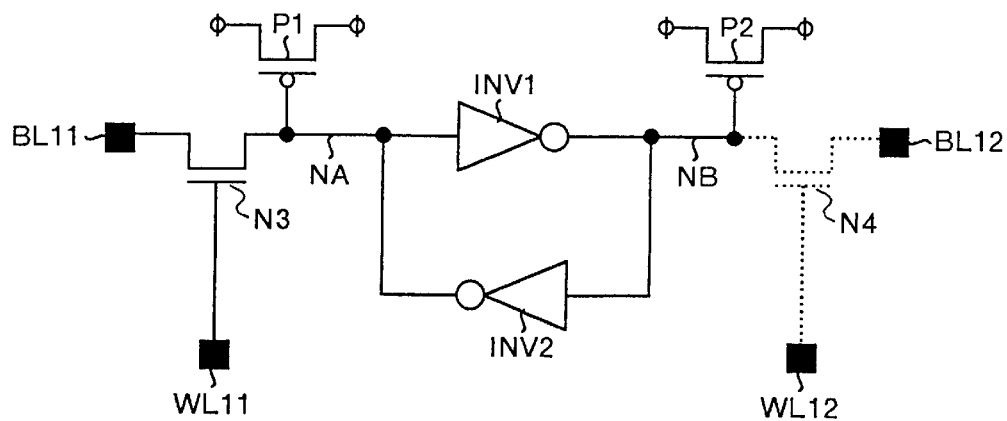
FIG. 11 is one example of a circuit diagram of the SRAM memory cell composing the semiconductor storage device according to the seventh embodiment.
Figure 12:
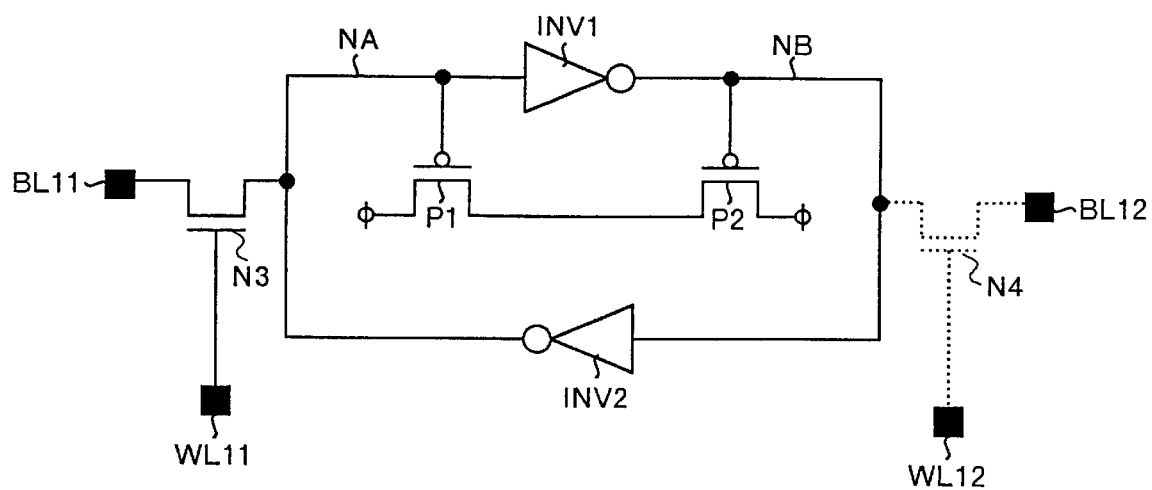
FIG. 12 is one example of a circuit diagram of the SRAM memory cell composing the semiconductor storage device according to the seventh embodiment.
Figure 13:
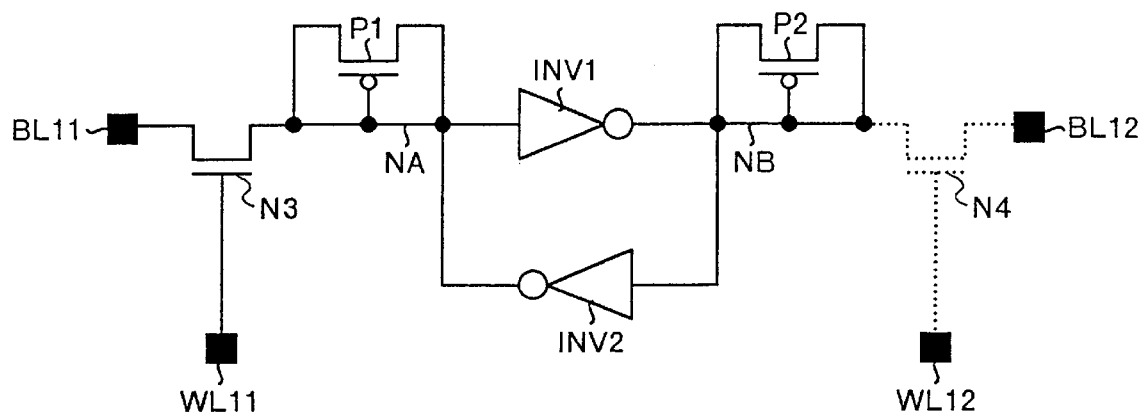
FIG. 13 is one example of a circuit diagram of the SRAM memory cell composing the semiconductor storage device according to the seventh embodiment.
Figure 14:
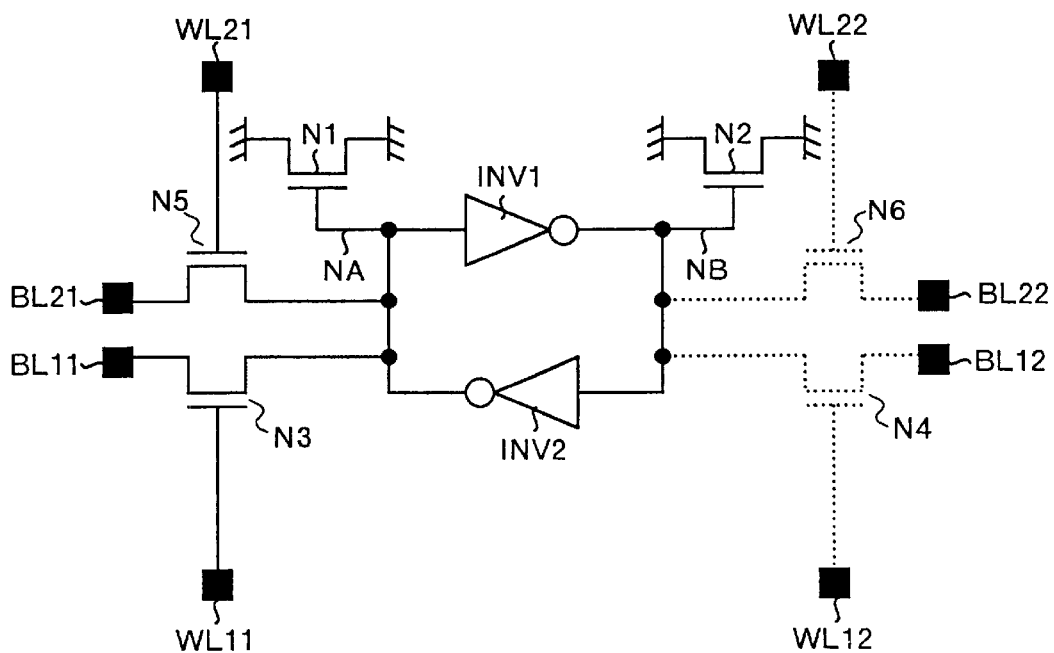
FIG. 14 is one example of a circuit diagram of the SRAM memory cell composing the semiconductor storage device according to an eighth embodiment.
Figure 15:
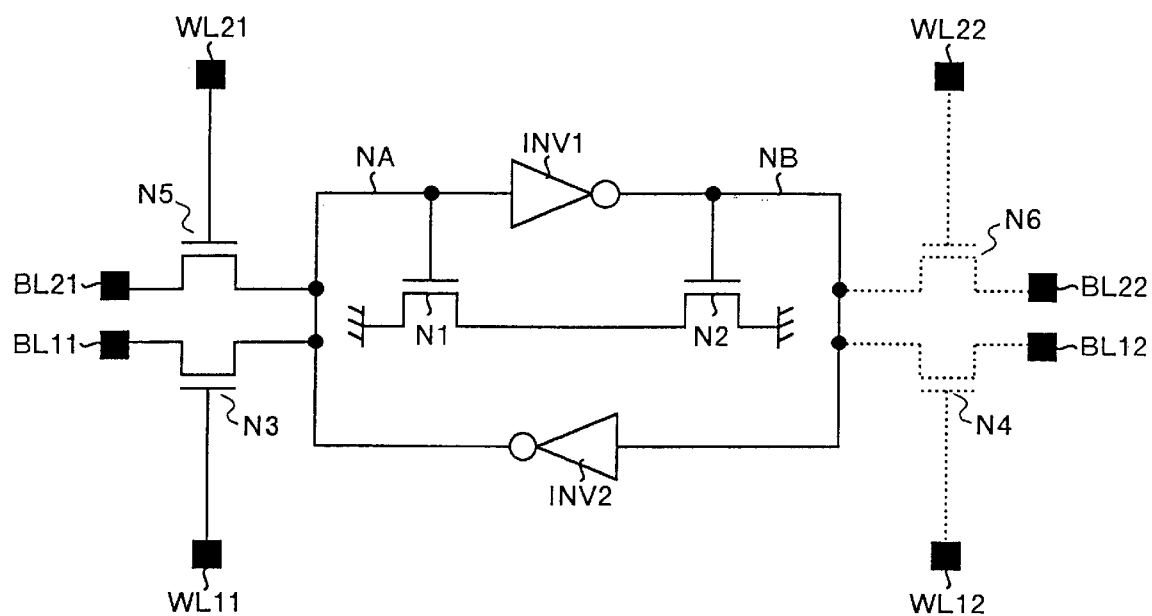
FIG. 15 is one example of a circuit diagram of the SRAM memory cell composing the semiconductor storage device according to the eighth embodiment.
Figure 16:
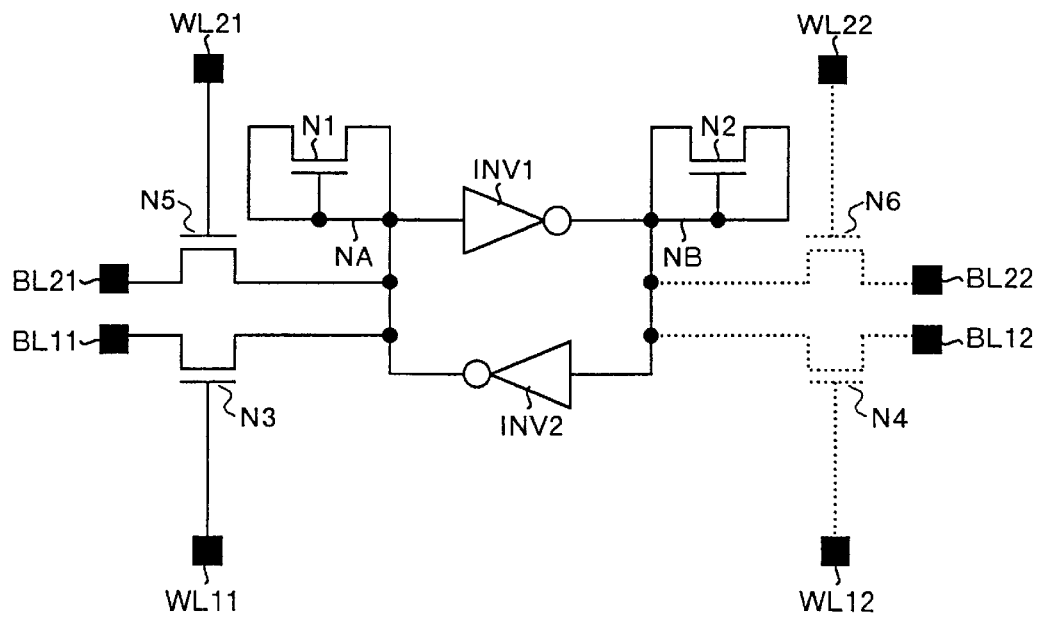
FIG. 16 is one example of a circuit diagram of the SRAM memory cell composing the semiconductor storage device according to the eighth embodiment.
Figure 17:
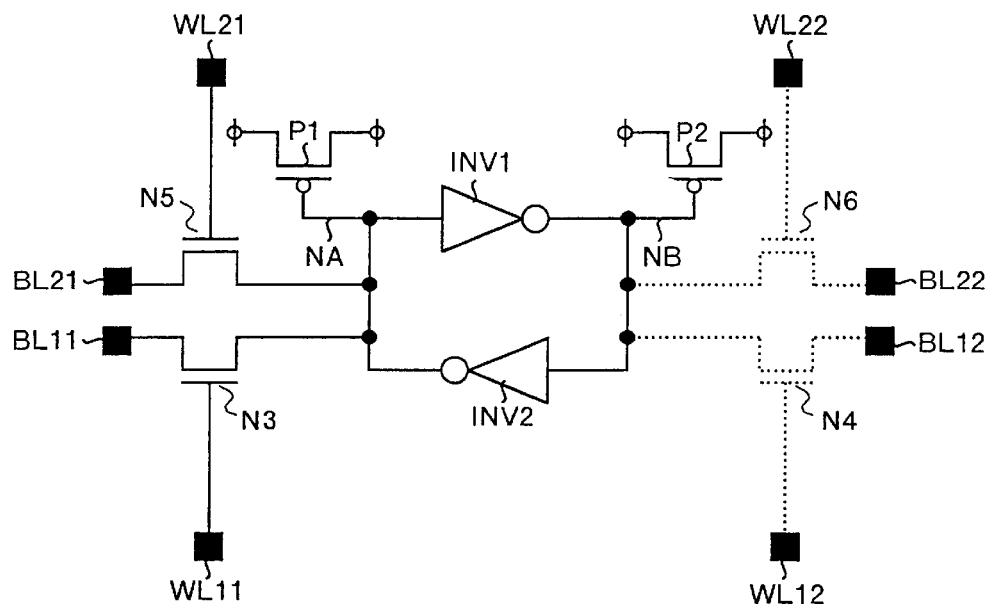
FIG. 17 is one example of a circuit diagram of the SRAM memory cell composing the semiconductor storage device according to the eighth embodiment.
Figure 18:
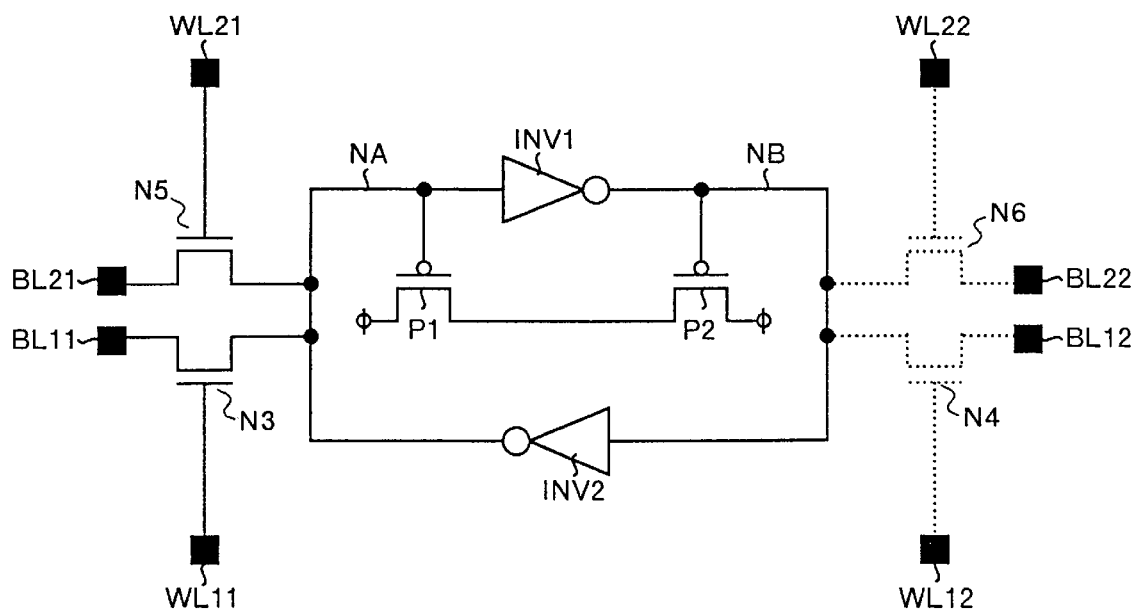
FIG. 18 is one example of a circuit diagram of the SRAM memory cell composing the semiconductor storage device according to the eighth embodiment.
Figure 19:
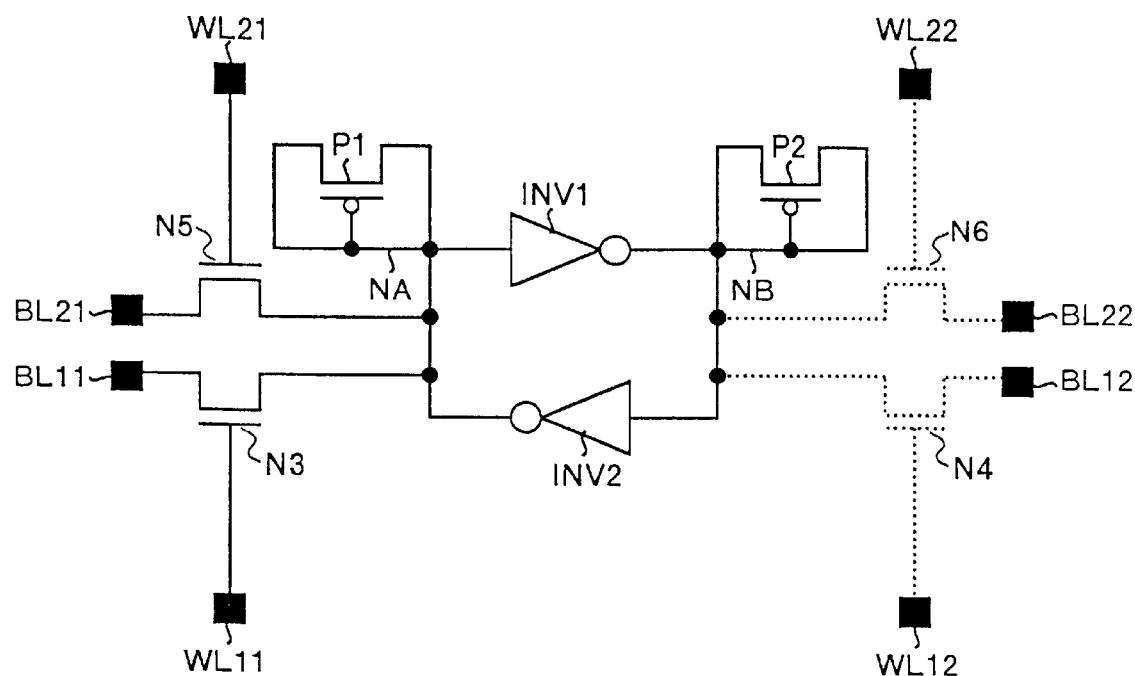
FIG. 19 is one example of a circuit diagram of the SRAM memory cell composing the semiconductor storage device according to the eighth embodiment.

FIG. 7 shows still another example of the circuit diagram of the SRAM memory cell composing the semiconductor storage device according to the fifth embodiment. Particularly, in the SRAM memory cell shown in FIG. 7, the NMOS transistors N1 and N2 in the fourth embodiment are replaced by the PMOS transistors P1 and P2, and the source and drain of the PMOS transistor P1 are connected to each other, and the source and the drain of the PMOS transistor P2 are connected to each other in the circuit diagram shown in FIG. 4.

In the SRAM memory cell shown in FIG. 7, when the storage node NA is stable in the logical state "H", the PMOS transistor P1 is in OFF state, and the PMOS transistor P2 is ON state. Here, since the source, drain and gate of the PMOS transistor P1 are connected to each other, they have the electric potential same as that of the storage node NA regardless of the OFF state, and the PMOS transistor P1 shows the logical state "H". Since the source, drain and gate of the PMOS transistor P2 are also connected to each other, they have the electric potential same as that of the storage node NB regardless of the ON state, and the PMOS transistor P2 shows the logical state "L".

On the contrary, when the storage node NA is stable in the logical state "L", the PMOS transistor P1 is in ON state, and the PMOS transistor P2 is OFF state. Here, since the source, drain and gate of the PMOS transistor P1 are connected to each other, they have the electric potential same as that of the storage node NA regardless of the ON state, and the PMOS transistor P1 shows the logical state "L". Since the source, drain and gate of the PMOS transistor P2 are also connected to each other, they have the electric potential same as that of the storage node NB regardless of the OFF state, and the PMOS transistor P2 shows the logical state "H".

Therefore, a change in the ON/OFF state of the PMOS transistors P1 and P2 does not influence the two stable storage states of the storage nodes NA and NB. Further, since the sources and drains of the added PMOS transistors P1 and P2 are not in open state, electric potentials to be added to the gate, namely, the electric potentials of the storage nodes NA and NB prevent electric current from flowing in the PMOS transistors P1 and P2 and from fluctuating.

According to the semiconductor storage device according to the fifth embodiment, the MOS transistors which are connected to the storage nodes NA can be replaced by the PMOS transistors in the second to fourth embodiments. Particularly depending on the layout structures of the memory cell, when the MOS transistors to be newly added are replaced by the PMOS transistors, it is occasionally advantageous to a cell area.

The semiconductor storage device according to a sixth embodiment will now be explained. The semiconductor storage device according to the sixth embodiment is characterized in that the connection represented by the dotted lines is not executed and the open state is held in the SRAM memory cell of the semiconductor storage device shown in FIGS. 3, 4, 6 and 7.

Namely, in FIG. 3, the sources of the NMOS transistors N1 and N2 are kept in an open state, and in FIG. 6 the sources of the PMOS transistors P1 and P2 are kept in an open state. Moreover, in FIG. 4 the sources or the drains of the NMOS transistors N1 and N2 are kept in an open state, and in FIG. 7 the sources or the drains of the PMOS transistors P1 and P2 are kept in an open state.

As explained above, according to the semiconductor storage device of the sixth embodiment, since the sources or drains of the newly added MOS transistors N1, N2, P1 and P2 are in the open state, a wiring for connecting the sources and drains can be eliminated. As a result, a limit of a wiring layout for connecting the gates of the newly added MOS transistors N1, N2, P1 and P2 to the storage nodes NA and NB can be reduced, and this means that a gate area can be further enlarged. Namely, a gate capacity to be added to the storage nodes of the memory cell can be enlarged, and resistance to a soft error can be improved further.

The semiconductor storage device according to a seventh embodiment will now be explained. The semiconductor storage device according to the seventh embodiment is characterized in that access transistors are provided to the storage nodes NA and NB so that storage data can be read and written in the SRAM memory cell of the semiconductor storage device in the embodiments 2 to 6.

FIGS. 8 to 13 are circuit diagram s showing the case where the access transistors are connected in FIGS. 2 to 7. Same legends are provided to the portions that are common to those in FIGS. 2 to 7, and the description thereof is omitted. Moreover, in FIGS. 8 to 13, connection terminals BL11 and BL12 are connection terminals to be connected to bit lines, and connection terminals WL11 and WL12 are connection terminals to be connected with wird lines.

In the semiconductor storage device according to the seventh embodiment, as shown in FIGS. 8 to 13, an access-use NMOS transistor N3 is provided in the SRAM memory cell in the second to fifth embodiments. The source of the NMOS transistor N3 is connected to the storage node NA, the connection terminal BL11 is connected to the drain, and the connection terminal WL11 is connected to the gate.

Operation in the SRAM memory cell shown in FIGS. 8 to 13 that are common to all will now be explained. When the connection terminal WL11 with the word line is in the logical state "L", the NMOS transistor N3 is in OFF state, and the storage node NA is not electrically connected to the connection terminal BL11 with the bit line corresponding to data reading/writing terminal. Namely, the storage data are held.

Here, when the connection terminal WL11 with the word line is changed from the logical state "L" in to the logical state "H" by an external signal, the NMOS transistor N3 is changed from OFF state in to ON state so that the storage node NA is electrically connected to the connection terminal BL11. If a writing voltage is not applied from the outside to the connection terminal BL11, the data held at the storage node NA are propagated to the connection terminal BL11 via the NMOS transistor N3. Namely, the data reading operation is performed.

Meanwhile, when the connection terminal WL11 is in the logical state "H" and the writing voltage is applied from the outside to the connection terminal BL11 (namely, strongly driven to L or H by an external circuit, not shown), the writing voltage is propagated to the storage node NA via the NMOS transistor N3 so that the storage node NA is rewritten to the logical state corresponding to the writing voltage. Namely, the data writing operation is performed. When the connection terminal WL11 is changed from the logical state "H" in to the logical state "L" by an external signal, the storage node NA is again returned to the holding state.

As mentioned above, according to the semiconductor storage device of the seventh embodiment, since the access-use NMOS transistor N3 is provided to the storage node NA in the embodiments 2 to 5, the data reading operation and writing operation can be performed for the semiconductor device where the effect of the embodiments 2 to 5, namely, the resistance to soft error is improved.

As represented by the dotted lines in FIGS. 8 to 13, an access-use NMOS transistor N4 may be provided to the storage node NB. Namely, the source of the NMOS transistor N4 is connected to the storage node NB, and the connection terminal BL12 with the bit line is connected to the drain, and the connection terminal WL12 with the word line is connected to the gate. Since the operation of the access-use NMOS transistor N4 is the same as the operation of the above-mentioned NMOS transistor N3, the description thereof is omitted.

Normally, the operation of SRAM is performed as a pair of bit lines which are connected to the connection terminals WL11 and WL12 commonly and where the connection terminals BL11 and BL12 establish a complementary relationship. However, the access-use NMOS transistors N3 and N4 can be operated independently.

The semiconductor storage device according to an eighth embodiment will now be explained. The semiconductor storage device according to the eighth embodiment is characterized in that two access-use transistors are provided respectively to the storage nodes NA and NB so that the operations for reading and writing the storage data can be performed, namely, two-port SRAM is composed in the SRAM memory cell of the semiconductor storage device in the second to sixth embodiments.

FIGS. 14 to 19 are circuit diagrams showing the case where two access-use transistors are connected to one storage node in FIGS. 2 to 7. Same legends are provided to the portions that are common to those in FIGS. 8 to 13, and the description thereof is omitted. Moreover, In FIGS. 14 to 19, the connection terminals BL11, BL12, BL21 and BL22 are connection terminals with bit lines, and the connection terminals WL11, WL12, WL21 and WL22 are connection terminals with word lines.

In the semiconductor storage device according to the eighth embodiment, as shown in FIGS. 14 to 19, an access-use NMOS transistor N3 and an access-use NMOS transistor N5 are provided in the SRAM memory cell in the embodiments 2 to 5. The source of the NMOS transistor N3 is connected to the storage node NA, the connection terminal BL11 is connected to the drain, and the connection terminal WL11 is connected to the gate. The source of the NMOS transistor N5 is connected to the storage node NA, the connection terminal BL21 is connected to the drain, and the connection terminal WL21 is connected to the gate.

Operation in the SRAM memory cell shown in FIGS. 14 to 19 that are common to all will now be explained. When the connection terminals WL11 and WL21 with the word line is in the logical state "L", the NMOS transistors N3 and N5 are in OFF state, and the storage node NA is not electrically connected to the connection terminals BL11 and BL21 with the bit line corresponding to data reading/writing terminals. Namely, the storage data are held.

When the connection terminal WL11 or WL21 is changed from the logical state "L" in to the logical state "H" by an external signal, the NMOS transistor N3 or N5 are changed from OFF state in to ON state so that the storage node NA is electrically connected to the connection terminal BL11 or BL21. If a writing voltage is not applied from the outside to the connection terminal BL11 or BL21, the data held at the storage node NA are propagated to the connection terminal BL11 or BL21 via the NMOS transistor N3 or N5. Namely, the data reading operation is performed.

Meanwhile, when the connection terminal WL11 or WL21 is in the logical state "H" and the writing voltage is applied from the outside to the connection terminal BL11 or BL21 (namely, strongly driven to L or H by an external circuit, not shown), the writing voltage is propagated to the storage node NA via the NMOS transistor N3 or N5 so that the storage node NA is rewritten to the logical state corresponding to the writing voltage. Namely, the data writing operation is performed. When the connection terminal WL11 or WL21 is changed from the logical state "H" in to the logical state "L" by an external signal, the storage node NA is again returned to the holding state.

As mentioned above, according to the semiconductor storage device of the eighth embodiment, since the two access-use NMOS transistors N3 and N4 are provided to the storage node NA in the second to fifth embodiments, the data reading operation and writing operation can be performed for the semiconductor device composed of two-port SRAM where the effect of the second to fifth embodiments, namely, the resistance to soft error is improved.

As represented by the dotted lines in FIGS. 14 to 19, access-use NMOS transistors N4 and N6 may be provided to the storage node NB. Namely, the source of the NMOS transistor N4 is connected to the storage node NB, and the connection terminal BL12 with the bit line is connected to the drain, and the connection terminal WL12 with the word line is connected to the gate. Moreover, the source of the NMOS transistor N6 is connected to the storage node NB, and the connection terminal BL22 with the bit line is connected to the drain, and the connection terminal WL22 with the word line is connected to the gate. Since the operations of the access-use NMOS transistors N4 and N6 are the same as the operations of the above-mentioned NMOS transistors N3 and N5, the description thereof is omitted.

As explained above, according to the present invention, for example, diode-connected load transistors such as MOS transistors are connected respectively to the drains of first and second MOS transistors so that the SRAM memory cell is composed. At this time, since the gates of third and fourth MOS transistors are connected respectively to first and second nodes to be storage nodes, capacity values for these gate capacities can be added to the storage nodes. As a result, malfunction such as in version of storage data due to external factors such as α-rays hardly occurs, and the resistance to soft error can be improved.

Further, the inverter which is composed of the first and fifth MOS transistors is connected to the inverter which is composed of the second and sixth MOS transistors complementarily so that the SRAM memory cell is constituted. Since the gate of the third MOS transistor and the gate of the fourth MOS transistor are connected respectively to the first and second nodes to be the storage nodes, the capacity values for those gate capacities can be added to the storage nodes. As a result, malfunction such as in version of storage data due to external factors such as α-rays hardly occurs, and the resistance to soft error can be improved.

Further, the sources and drains of the third and fourth MOS transistors provided for adding the capacity values of the gate capacities to the storage nodes are connected to the ground lines or the power-supply lines. Therefore, electric current is prevented from flowing in the third and fourth MOS transistors and from fluctuating according to the ON/OFF state of the third and fourth MOS transistors more effectively than the case where the sources and drains are in open state. As a result, the possibility that the operating states of the third and fourth MOS transistors influences the storage nodes can be reduced.

Further, the sources or drains of the third and fourth MOS transistors for adding the capacity values for gate capacities to the storage nodes are connected to each other. Therefore, in comparison with the case where the sources or drains are in open state, electric current is prevented from flowing in the MOS transistors and from fluctuating according to the ON/OFF state of the third and fourth transistors. As a result, the possibility that the operating states of the third and fourth MOS transistors influences the storage nodes can be reduced.

Further, the sources or drains of the third and fourth MOS transistors for adding the capacity values for gate capacities to the storage nodes are connected to each other and the sources or the drains are connected to the ground lines or power-supply lines. Therefore, electric current is prevented from flowing in the MOS transistors and from fluctuating according to the ON/OFF state of the third and fourth transistors more effectively than the case where the sources or drains are in open state. As a result, the possibility that the operating states of the third and fourth MOS transistors influences the storage nodes can be reduced.

Further, in the third and fourth MOS transistors for adding the capacity values for gate capacities to the storage nodes, since the gates and the sources or drains are connected to each other, electric current is prevented from flowing in the MOS transistors and from fluctuating according to the ON/OFF state of the third and fourth transistors more effectively than the case where the sources or drains are in open state. As a result, the possibility that the operating states of the third and fourth MOS transistors influences the storage nodes can be reduced.

Further, in the third and fourth MOS transistors for adding the capacity values for gate capacities to the storage nodes, since the gates, the sources and drains are connected to each other, electric current is prevented from flowing in the MOS transistors and from fluctuating according to the ON/OFF state of the third and fourth transistors more effectively than the case where the sources or drains are in open state. As a result, the possibility that the operating states of the third and fourth MOS transistors influences the storage nodes can be reduced.

Further, the third and fourth MOS transistors for adding the capacity values for gate capacities to the storage nodes can be replaced by N-channel MOS transistors. Particularly depending on layout structures of a memory cell, when the N-channel MOS transistors are used as the newly added MOS transistors, this is advantageous to a cell area.

Further, the third and fourth MOS transistors for adding the capacity values for gate capacities to the storage nodes can be replaced by P-channel MOS transistors. Particularly depending on layout structures of a memory cell, when the P-channel MOS transistors are used as the newly added MOS transistors, this is advantageous to a cell area.

Further, an SRAM memory cell is constituted so that access-use MOS transistors for reading and writing storage data are connected to the first and second nodes to be storage nodes respectively. Moreover, an SRAM memory cell is composed of two-port SRAM in which two access-use MOS transistors are connected to the first and second nodes respectively. The third and fourth MOS transistors are added to the above SRAM memory cells so that the capacity values for gate capacities can be added, and the resistance to soft error can be improved.

Although the invention has been described with respect to a specific embodiment for a complete and clear disclosure, the appended claims are not to be thus limited but are to be construed as embodying all modifications and alternative constructions that may occur to one skilled in the art which fairly fall with in the basic teaching herein set forth.

What is claimed is:

1. A semiconductor storage device comprising:
   a first MOS transistor, which is of an N-channel type, having a source connected to a ground line;
   a second MOS transistor, which is of an N-channel type, having a source connected to a ground line, a drain connected to a gate of said first MOS transistor and its connection point being a first node, and a gate connected to a drain of said first MOS transistor and its connection point being a second node;
   a third MOS transistor, which is either of an N-channel type MOS transistor or a P-channel type MOS transistor, having a gate connected to said first node, and at least one of a source and a drain being in an open state;
   a fourth MOS transistor, which is either of an N-channel type MOS transistor or a P-channel type MOS transistor, having a gate connected to said second node, and at least one of a source and a drain being in an open state;
   a fifth MOS transistor, which is of a P-channel type, having a source connected to a power-supply line, a drain connected to the drain of said first MOS transistor, and a gate connected to the gate of said first MOS transistor; and
   a sixth MOS transistor, which is of a P-channel type, having a source connected to a power-supply line, a drain connected to the drain of said second MOS transistor, and a gate connected to the gate of said second MOS transistor.

2. The semiconductor storage device according to claim 1, wherein one of the source and the drain of said third MOS transistor is connected to one of the source and the drain of said fourth MOS transistor and a remaining one of the sources and the drains of said third and fourth MOS transistors are in an open state.

3. A semiconductor storage device comprising:
   a first MOS transistor, which is of an N-channel type, having a source connected to a ground line;
   a second MOS transistor, which is of an N-channel type, having a source connected to a ground line, a drain connected to a gate of said first MOS transistor and its connection point being a first node, and a gate connected to a drain of said first MOS transistor and its connection point being a second node;
   a third MOS transistor, which is either of an N-channel type MOS transistor or a P-channel type MOS transistor, having a gate connected to said first node;
   a fourth MOS transistor, which is either of an N-channel type MOS transistor or a P-channel type MOS transistor, having a gate connected to said second node;
   a fifth MOS transistor, which is of a P-channel type, having a source connected to a power-supply line, a drain connected to the drain of said first MOS transistor, and a gate connected to the gate of said first MOS transistor; and
   a sixth MOS transistor, which is of a P-channel type, having a source connected to a power-supply line, a drain connected to the drain of said second MOS transistor, and a gate connected to the gate of said second MOS transistor,
   wherein the drain and source of said third MOS transistor are connected to the ground line or the power-supply line, and the drain and the source of said fourth MOS transistor are connected to the ground line or the power-supply line.

4. A semiconductor storage device comprising:

a first MOS transistor, which is of an N-channel type, having a source connected to a ground line;

a second MOS transistor, which is of an N-channel type, having a source connected to a ground line, a drain connected to a gate of said first MOS transistor and its connection point being a first node, and a gate connected to a drain of said first MOS transistor and its connection point being a second node;

a third MOS transistor, which is either of an N-channel type MOS transistor or a P-channel type MOS transistor, having a gate connected to said first node;

a fourth MOS transistor, which is either of an N-channel type MOS transistor or a P-channel type MOS transistor, having a gate connected to said second node;

a fifth MOS transistor, which is of a P-channel type, having a source connected to a power-supply line, a drain connected to the drain of said first MOS transistor, and a gate connected to the gate of said first MOS transistor; and a sixth MOS transistor, which is of a P-channel type, having a source connected to a power-supply line, a drain connected to the drain of said second MOS transistor, and a gate connected to the gate of said second MOS transistor, wherein the gate and the source or the drain of said third MOS transistor are connected to each other, and the gate and the source or the drain of said fourth MOS transistor are connected to each other.

5. A semiconductor storage device comprising:

a first MOS transistor, which is of an N-channel type, having a source connected to a ground line;

a second MOS transistor, which is of an N-channel type, having a source connected to a ground line, a drain connected to a gate of said first MOS transistor and its connection point being a first node, and a gate connected to a drain of said first MOS transistor and its connection point being a second node;

a third MOS transistor, which is either of an N-channel type MOS transistor or a P-channel type MOS transistor, having a gate connected to said first node;

a fourth MOS transistor, which is either of an N-channel type MOS transistor or a P-channel type MOS transistor, having a gate connected to said second node;

a fifth MOS transistor, which is of a P-channel type, having a source connected to a power-supply line, a drain connected to the drain of said first MOS transistor, and a gate connected to the gate of said first MOS transistor; and a sixth MOS transistor, which is of a P-channel type, having a source connected to a power-supply line, a drain connected to the drain of said second MOS transistor, and a gate connected to the gate of said second MOS transistor, wherein the gate and the source and the drain of said third MOS transistor are connected to each other, and the gate and the source and the drain of said fourth MOS transistor are connected to each other.

6. A semiconductor storage device comprising:

a first MOS transistor, which is of an N-channel type, having a source connected to a ground line;

a second MOS transistor, which is of an N-channel type, having a source connected to a ground line, a drain connected to a gate of said first MOS transistor and its connection point being a first node, and a gate connected to a drain of said first MOS transistor and its connection point being a second node;

a third MOS transistor, which is either of an N-channel type MOS transistor or a P-channel type MOS transistor, having a gate connected to said first node;

a fourth MOS transistor, which is either of an N-channel type MOS transistor or a P-channel type MOS transistor, having a gate connected to said second node, wherein one of a source and a drain of said third MOS transistor is connected to one of a source and a drain of said fourth MOS transistor and a remaining one of the source and the drain of said third MOS transistor is connected to a remaining of one of the source and the drain of said fourth MOS transistor;

a fifth MOS transistor, which is of a P-channel type, having a source connected to a power-supply line, a drain connected to the drain of said first MOS transistor, and a gate connected to the gate of said first MOS transistor; and a sixth MOS transistor, which is of a P-channel type, having a source connected to a power-supply line, a drain connected to the drain of said second MOS transistor, and a gate connected to the gate of said second MOS transistor.

7. The semiconductor storage device according to claim 6, wherein a node, to which one of the source and the drain of said third MOS transistor and one of the source and the drain of said fourth MOS transistor is connected, is connected to ground or to a power supply line.

* * * * *